(12) United States Patent
Takanashi et al.

(10) Patent No.: US 7,217,464 B2
(45) Date of Patent: May 15, 2007

(54) METHOD OF MANUFACTURING ELECTRODEPOSITED COPPER FOIL WITH CARRIER FOIL FOR HIGH-TEMPERATURE HEAT-RESISTANCE AND ELECTRODEPOSITED COPPER FOIL WITH CARRIER FOIL FOR HIGH-TEMPERATURE HEAT-RESISTANCE OBTAINED BY THE MANUFACTURING METHOD

(75) Inventors: Akitoshi Takanashi, Ageo (JP); Kenichiro Iwakiri, Ageo (JP); Akiko Sugimoto, Ageo (JP); Junshi Yoshioka, Ageo (JP); Shinichi Obata, Ageo (JP); Makoto Dobashi, Ageo (JP)

(73) Assignee: Mitsui Mining & Smelting Co., Ltd., Shinagawa-ku, Tokyo (JP)

( * ) Notice: Subject to any disclaimer, the term of this patent is extended or adjusted under 35 U.S.C. 154(b) by 27 days.

(21) Appl. No.: 10/483,612
(22) PCT Filed: May 12, 2003
(86) PCT No.: PCT/JP03/05892
§ 371 (c)(1),
(2), (4) Date: Jan. 14, 2004
(87) PCT Pub. No.: WO03/095714
PCT Pub. Date: Nov. 20, 2003

(65) Prior Publication Data
US 2004/0170858 A1 Sep. 2, 2004

(30) Foreign Application Priority Data
May 14, 2002 (JP) ............................... 2002-138881

(51) Int. Cl.
*B32B 15/04* (2006.01)
*B32B 15/20* (2006.01)
*B05D 1/18* (2006.01)
*B05D 3/10* (2006.01)
*C23G 1/02* (2006.01)

(52) U.S. Cl. .................. 428/674; 428/457; 428/624; 428/675; 205/125; 205/239; 205/291; 134/3; 216/108; 427/309; 427/435

(58) Field of Classification Search ............... 428/624, 428/674, 675, 457, 680, 678; 205/705, 125, 205/239, 291, 317; 134/41, 38, 39, 40, 2, 134/3; 216/108, 109, 106, 107, 103, 104; 427/435, 307, 309, 98.6, 98.8, 388.1
See application file for complete search history.

(56) References Cited

U.S. PATENT DOCUMENTS 6,319,620 B1 * 11/2001 Kataoka et al. ............. 428/626

(Continued)

FOREIGN PATENT DOCUMENTS

EP 960725 A2 12/1999

(Continued)

*Primary Examiner*—Michael E. LaVilla
(74) *Attorney, Agent, or Firm*—Rothwell, Figg, Ernst & Manbeck PC

(57) ABSTRACT

The object is to provide a method of manufacturing electrodeposited copper foil with a carrier foil for high-temperature heat-resistance in which the peeling of the carrier foil is easy even by press working at temperatures of not less than 200°C. For this purpose are adopted "a method of manufacturing electrodeposited copper foil with a carrier foil for high-temperature heat-resistance in which an organic adhesive interface layer is formed on a surface of carrier foil by use of an organic agent, and an electrodeposited copper foil layer is formed on the organic adhesive interface layer, characterized in that the formation of the organic adhesive interface layer on the surface of the carrier foil is performed by acid pickling the surface of the carrier foil by use of an acid pickling solution containing 50 ppm to 2000 ppm of organic agent used in the formation of the adhesive interface layer and by simultaneously causing the organic agent to be adsorbed whereby an acid pickled and adsorbed organic film is formed" and others.

15 Claims, 5 Drawing Sheets

(a) Acid pickling
(Formation of acid pickled and adsorbed organic film)

(b) Formation of electrodeposited copper foil layer (c) Nodular treatment and passivation

U.S. PATENT DOCUMENTS

| | | | |
|---|---|---|---|
| 6,610,418 B1 * | 8/2003 | Yoshioka et al. | 428/607 |
| 6,777,108 B1 * | 8/2004 | Obata et al. | 428/624 |
| 2003/0148136 A1 * | 8/2003 | Yamamoto et al. | 428/607 |
| 2004/0067377 A1 * | 4/2004 | Sugimoto et al. | 428/469 |

FOREIGN PATENT DOCUMENTS

| | | |
|---|---|---|
| EP | 996318 A2 | 4/2000 |
| JP | 2000-151068 A | 5/2000 |
| JP | 2000-309898 A | 11/2000 |
| JP | 2001-140091 * | 5/2001 |
| WO | WO 98/51485 A1 | 11/1998 |

* cited by examiner (a) Acid pickling
(Formation of acid pickled and adsorbed organic film)

(b) Formation of electrodeposited copper foil layer (c) Nodular treatment and passivation (a) Acid pickling
(Formation of acid pickled and adsorbed organic film)

(b) Formation of simple adsorbed organic film (c) Formation of electrodeposited copper foil layer (e) Nodular treatment and passivation (a) Acid pickling
(Formation of acid pickled and adsorbed organic film)

(b) Formation of dissimilar metal layer (c) Formation of electrodeposited copper foil layer (d) Nodular treatment and passivation

METHOD OF MANUFACTURING ELECTRODEPOSITED COPPER FOIL WITH CARRIER FOIL FOR HIGH-TEMPERATURE HEAT-RESISTANCE AND ELECTRODEPOSITED COPPER FOIL WITH CARRIER FOIL FOR HIGH-TEMPERATURE HEAT-RESISTANCE OBTAINED BY THE MANUFACTURING METHOD

CROSS REFERENCE TO RELATED APPLICATION

This application is a 35 USC § 371 National Phase Entry Application from PCT/JP03/05892, filed May 12, 2003, and designating the U.S.

TECHNICAL FIELD

The present invention relates to a method of manufacturing electrodeposited copper foil with a carrier foil for high-temperature heat-resistance and electrodeposited copper foil with a carrier foil for high-temperature heat-resistance obtained by using this manufacturing method.

BACKGROUND ART

Electrodeposited copper foil with a carrier foil has hitherto been used as basic materials for the manufacturing of printed wiring boards which are widely used in the field of the electrical and electronic industries. This electrodeposited copper foil with a carrier foil is bonded to a polymer insulating substrate, such as a glass-epoxy substrate, a phenol substrate and a polyimide, by hot pressing to form a copper-clad laminate, and is used in the manufacturing of printed wiring boards.

This electrodeposited copper foil with a carrier foil is thermocompressed to an B-stage cured prepreg by applying a high pressure in a high-temperature atmosphere (hereinafter this step is referred to as "press forming"), thereby preventing wrinkles from occurring in a copper foil layer during the manufacturing of a copper-clad laminate and hence making it possible to prevent the formation of cracks in the copper foil in wrinkle areas and to prevent the exudation of resin from the prepreg. And this makes it easy to form a thin copper foil layer on the surface of the copper-clad laminate.

In general, this electrodeposited copper foil with a carrier foil can be broadly divided into a peelable type and an etchable type. In a word, the difference is as follows. In the peelable type, the carrier foil is removed by peeling after press forming, whereas in the etchable type, the carrier foil is removed by an etching method after press forming.

In the peelable type, the value of peel strength of the carrier foil is very unstable after press forming. In an extreme case, the situation is such that the peelable type has the drawback that the carrier foil cannot be peeled and that the aimed peel strength cannot be easily obtained. In order to solve this problem, as electrodeposited copper foil with a carrier foil which eliminates the drawback of the conventional electrodeposited copper foil with a carrier foil of the peelable type and can stabilize the peel strength of an interface between the carrier foil and the electrodeposited copper foil at a low level, the present inventors have proposed electrodeposited copper foil with a carrier foil, as disclosed in the Japanese Patent Laid-Open No. 2000-309898, which is characterized in that in electrodeposited copper foil with a carrier foil in which an adhesive interface layer is formed on the surface of the carrier foil, copper is electrodeposited on this adhesive interface layer and this deposited copper layer is used as the electrodeposited copper foil, an organic agent is used in this adhesive interface layer.

However, an adhesive interface layer of the electrodeposited copper foil with a carrier foil which the present inventors have proposed was formed by causing an organic agent constituting the adhesive interface layer to be adsorbed on a surface of the carrier foil by use of an aqueous solution containing only this organic agent. This carrier foil-incorporated electrodeposited copper layer shows excellent performance at pressing temperatures of about 180° C. in the case of use of an ordinary FR-4 prepreg, and even after press forming the carrier foil can be very easily peeled.

However, recent years have seen increasing requirements for the downsizing of electronics and electric machinery and apparatus without showing any sign of an end to this trend, and multilayer design of printed wiring boards, which are the basic parts of electronics and electric equipment, high density design of copper foil circuits, and high density packaging design of mounted parts have been required more strongly than before. In such a case, because the quantity of heat released from mounted parts increases, printed wiring boards as built-in parts are also required to provide high heat resistance and hence highly heat resistant substrates such as a substrate using a BT resin, a fluoroplastic substrate and a polyimide substrate have come to be used. It is inevitable to adopt pressing temperatures exceeding 200° C. as the pressing temperature of copper-clad laminates using these substrates and the pressing temperature tends to become higher.

In recent markets, it has been required to provide the characteristic that even after laminating at pressing temperatures of not less than 300° C., the carrier foil can be easily peeled from the surface of a copper-clad laminate. It was a fact that when the electrodeposited copper foil with a carrier foil which the present inventors have hitherto proposed is press worked at temperatures of not less than 300° C., the peeling of the carrier foil is not stable, with the result that the phenomenon that the carrier foil cannot be peeled occurs. Therefore, the markets have demanded electrodeposited copper foil with a carrier foil of the peelable type excellent in high-temperature heat resistance which permits easy peeling of carrier foil even in the case of press working at temperatures of not less than 200° C. (hereinafter referred to as "electrodeposited copper foil with a carrier foil for high-temperature heat-resistance" in this specification).

DISCLOSURE OF THE INVENTION

Figure 1:
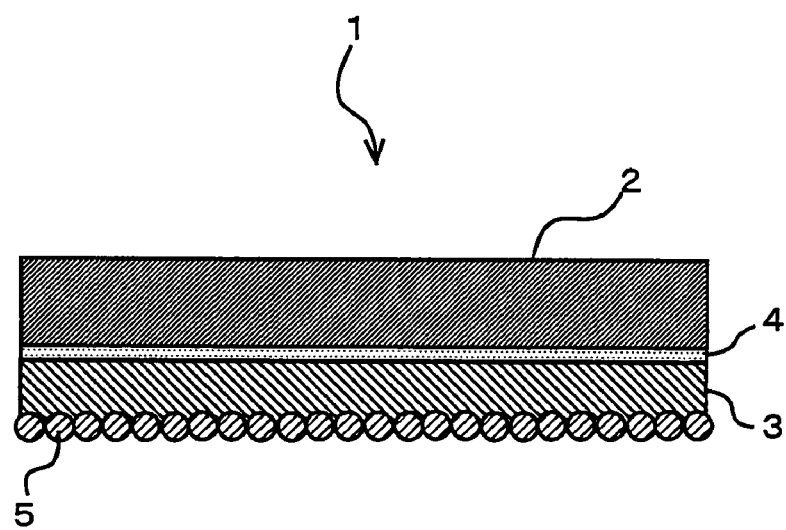
FIG. 1 is a schematic sectional view of electrodeposited copper foil with a carrier foil for high-temperature heat-resistance related to the present invention.

With this being the situation, the present inventors devoted themselves to conducting research and as a result hit upon the invention which will be described below. As shown in the schematic sectional view of FIG. 1, in first electrodeposited copper foil with a carrier foil for high-temperature heat-resistance 1 described in a claim, carrier foil 2 and electrodeposited copper foil 3 are in a state as if bonded together via an organic adhesive interface layer 4. Incidentally, it should be noted here that in order to make descriptions easy, the thickness of each layer shown in the drawings schematically expresses images and does not reflect the thickness of actual products.

A first manufacturing method is "a method of manufacturing electrodeposited copper foil with a carrier foil for high-temperature heat-resistance which involves forming an organic adhesive interface layer on a surface of carrier foil by use of an organic agent and forming an electrodeposited copper foil layer on the organic adhesive interface layer, characterized in that the formation of the organic adhesive interface layer on the surface of the carrier foil is performed by acid pickling and dissolving the surface of the carrier foil by use of an acid pickling solution containing 50 ppm to 2000 ppm of organic agent and by simultaneously causing the organic agent to be adsorbed whereby an organic layer is formed." It should be noted that in the foregoing and the following, electrodeposited copper foil and an electrodeposited copper foil layer, carrier foil and a carrier foil layer, and an organic adhesive interface and an organic adhesive interface layer respectively show the same part and may sometimes be appropriately used according to the contents of descriptions.

Figure 2:
FIGS. 2 to 5 are each a schematic drawing of the procedure for manufacturing electrodeposited copper foil with a carrier foil for high-temperature heat-resistance.
Figure 2:
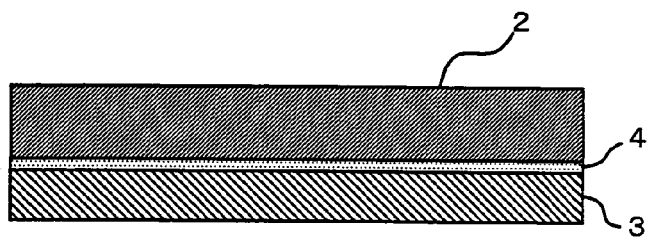
Figure 2:
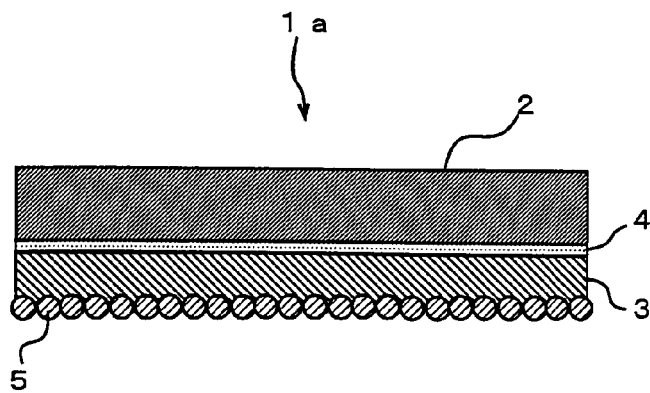

The procedure of this manufacturing method is schematically shown in FIGS. 2(a) to 2(c) and the steps will be described below by referring to this flow. The feature of the manufacturing method of this electrodeposited copper foil with a carrier foil for high-temperature heat-resistance resides in the fact that the organic adhesive interface is constituted by an organic film which is formed by acid pickling the carrier foil while simultaneously causing an organic agent to be adsorbed (in this specification, this organic film is referred to as "an acid pickled and adsorbed organic film"). This acid pickled and adsorbed organic film is formed by causing an organic agent used to constitute the organic adhesive interface to be contained in a solution for performing acid pickling in order to remove excessive oxide films and contaminations on the surface of the carrier foil and immersing the carrier foil in this solution, whereby the surface of the carrier foil is dissolved and simultaneously the components of the organic solvent are caused to be adsorbed on the surface of the carrier foil.

By mixing the organic agent which is caused to be adsorbed in the acid pickling solution in this manner, the rate of precipitation of the organic agent onto the carrier foil is increased and simultaneously the uniformity of adsorption is improved compared to a case where the organic agent is caused to be adsorbed in a state not accompanied by the dissolving of the carrier foil. Because the acid pickled and adsorbed organic film at this time is formed in the acid pickling solution in which metal ions of the dissolved metal constituting the carrier foil are present, the metal ions in the acid pickling solution react with the organic agent and perform complexing and, therefore, there is a strong possibility that the metal ions will be included in the organic film. As a result, it might be thought that the organic film comes to a state in which the metal component is included in a certain amount.

Therefore, the manufacturing of the electrodeposited copper foil with a carrier foil related to the present invention is started first by acid pickling the carrier foil 2 in the step of FIG. 2(a). The organic agent to form the acid pickled and adsorbed organic film which becomes an organic adhesive interface layer 4 is caused to coexist in the solution used in the acid pickling of this carrier foil 2, the surface of the carrier foil 2 is dissolved, a metal complex is caused to be formed from the dissolved metal ions and the organic solvent, and this metal complex is caused to be precipitated and adsorbed on the carrier foil 2. By adopting a technique like this, the adsorption structure of the organic agent which is precipitated and adsorbed becomes fine and, at the same time, it is possible to cause a large amount of organic agent to be uniformly adsorbed compared to a case where an organic agent is precipitated and adsorbed by contact with an aqueous solution in which the organic agent is simply dispersed.

That is, from the principle of the precipitation of an organic agent onto a metal surface, it may be thought as follows. Metal ions are generated in the dissolving process of the carrier foil 2, the metal ions and the organic agent form a complex, the precipitation of this complex is promoted by a concentration gradient due to a pH change in the vicinity of the surface of the carrier foil and others, with the result that the adsorption of the organic agent which has become a complex onto the surface of the carrier foil becomes easy and, therefore, the adsorption rate of the organic agent increases, enabling a dense organic film to be formed. Strictly speaking, it might be thought that the precipitation phenomenon of the organic agent at this time is metal ion type precipitation and that this precipitated organic agent is adsorbed on the surface of the carrier foil 2.

The acid pickling solution used here has somewhat different compositions according to the types of carrier foil and the compositions may be varied according to the types of carrier foil and the acid pickling time. However, it is preferred that among other acid solutions a sulfuric acid solution be used. As a result, it follows that it is necessary to use as the carrier foil 2 metal foil of copper and copper alloys etc. and a resin film having a metal coating layer of copper and copper alloys etc. which are capable of being acid pickled in a sulfuric acid solution.

When an organic agent is added to this acid pickling solution, it is preferred that the organic agent be added so that the organic agent concentration becomes in the range of 50 ppm to 2000 ppm. When the concentration is less than 50 ppm, the adsorption rate of the organic agent becomes low and besides it seems that the thickness of an acid pickled and adsorbed organic film which is formed tends to become nonuniform. In contrast, the concentration of 2000 ppm, which is the maximum value, is such that in reality it is possible to dissolve the organic agent even this concentration is exceeded. However, this is because in consideration of the quality stability of the solution and economical efficiency in actual operation, it is unnecessary to adopt an excessive dissolved amount.

The temperature of the acid pickling solution at this time is not especially limited because the temperature may be appropriately selected in consideration of the acid pickling rate and the formation rate of the acid pickled and adsorbed organic film. However, at this time, in a case where the solution temperature is raised in order to cause the organic agent to coexist in the acid pickling solution, it is necessary to pay attention to the point that a temperature at which the decomposition of the organic agent does not occur must be selected depending on the types of the organic agent to be used.

As the organic agent it is desirable to use 1,2,3-benzotriazole (hereinafter referred to as "BTA"), carboxybenzotriazole (hereinafter referred to as "CBTA"), N',N'-bis(benzotriazolemethyl) urea (hereinafter referred to as "BTD-U"), 1H-1,2,4-triazole (hereinafter referred to as "TA") and 3-amino-1H-1,2,4-triazole (hereinafter referred to as "ATA"), etc., which are triazole compounds having a substituent among other nitrogen-containing organic compounds.

The electrodeposited copper foil layer 3 is a copper layer, which is provided on the above-described organic adhesive interface layer 4, is directly bonded to a substrate resin of the copper-clad laminate and is a portion used in circuit formation. In the step shown in FIG. 2(b), by causing the carrier foil 2 itself, on which the organic adhesive interface layer 4 has been formed, to be cathode polarized in a copper electrolyte, the copper component is precipitated on the organic adhesive interface layer 4 to form a copper foil layer as this electrodeposited copper foil layer 3. The copper electrolyte and electrolysis conditions used at this time are not especially limited and solutions capable of being used as a copper ion supply source, such as a copper sulfate-base solution and a copper pyrophosphate-base solution, are used. For example, the conditions in the case of a copper sulfate-base solution are a copper concentration of 30 to 100 g/l, a sulfuric acid concentration of 50 to 200 g/l, a solution temperature of 30 to 80° C. and a current density of 1 to 100 A/dm$^2$, and in the case of a copper pyrophosphate-base solution, the conditions are a copper concentration of 10 to 50 g/l, a potassium pyrophosphate concentration of 100 to 700 g/l, a solution temperature of 30 to 60° C., pH 8 to 12 and a current density of 1 to 10 A/dm$^2$.

In order to improve the adhesion of this electrodeposited copper foil layer 3 when it is bonded to the substrate, in general it is preferable to perform nodular treatment, such as causing fine copper particles 5 to be adhered and forming projections and depressions, as shown in the schematic sectional view of FIG. 1. However, it should be noted here that in some cases the nodular treatment itself may become unnecessary. For example, in the step shown in FIG. 2(c), in a case where nodular treatment is performed by depositing fine copper particles 5 on the electrodeposited copper foil layer 3 and causing these fine copper particles to adhere thereto by use of the electrolysis process, what is called burn plating conditions are adopted by use of a copper electrolyte and covering plating treatment is performed as required in order to prevent the fine copper particles 5 from falling off.

If a copper sulfate-base solution, for example, is used in the burn plating used to the adhering and forming of fine copper particles at this time, the conditions are a copper concentration of 5 to 20 g/l, a sulfuric acid concentration of 50 to 200 g/l, additives as required (α-napthoquinoline, dextrin, glue, thiourea, etc.), a solution temperature of 15 to 40° C. and a current density of 10 to 50 A/dm$^2$. Incidentally, the burn plating conditions are not especially limited and are determined in consideration of the characteristics of a production line. However, it is also possible to omit this nodular treatment according to uses.

When the fine copper particles 5 are caused to adhere to the surface of the electrodeposited copper foil layer 3, in order to prevent the falling-off of the fine copper particles 5 which have been deposited and caused to adhere, covering plating to coat the fine copper particles 5 is performed under level plating conditions as needed. Also the level plating conditions are not especially limited and are determined in consideration of the characteristics of a production line. For example, if a copper sulfate-base solution is used, the conditions are a copper concentration of 50 to 80 g/l, a sulfuric acid concentration of 50 to 150 g/l, a solution temperature of 40 to 50° C. and a current density of 10 to 50 A/dm$^2$.

Passivation is a step for preventing the corrosion of the surface of the electrodeposited copper foil layer by oxidation so that no bottleneck is produced during the manufacturing process of a copper-clad laminate and a printed wiring board. There is no problem if either of organic passivation which uses benzotriazole, imidazole, etc. and inorganic passivation which uses zinc, chromate, zinc alloys, etc. is used as the method of passivation. It is necessary only that passivation suited to the purpose of use of the electrodeposited copper foil with a carrier foil be used. In the case of organic passivation, it is possible to adopt techniques such as the dip application, showering application and electrodeposition of an organic passivation agent.

In the case of inorganic passivation, it is possible to adopt a method by which a passivation element is precipitated by electrolysis on arbitrary surfaces of the carrier foil and the electrodeposited copper foil layer, what is called a substitutional deposition method, etc. For example, when zinc passivation is performed, it is possible to use a zinc pyrophosphate plating bath, a zinc cyanide plating bath, a zinc sulfate plating bath, etc. For example, in the case of a zinc pyrophosphate plating bath, the conditions are a zinc concentration of 5 to 30 g/l, a potassium pyrophosphate concentration of 50 to 500 g/l, a solution temperature of 20 to 50° C., pH 9 to 12 and a current density of 0.3 to 10 A/dm$^2$. Incidentally, in the drawings the descriptions of these passivation layers are completely omitted.

In the organic adhesive interface layer formed by the method described above, the organic film itself is thick and dense compared to an organic adhesive interface layer having only an organic film formed by use of the simple adsorption phenomenon (in this specification, this organic film is referred to as "a simple adsorbed organic film"). For this reason, it follows that even if the pressing temperature during press forming exceeds 200° C., the complete decomposition and disappearance of an organic agent forming the organic adhesive interface layer will not occur any more. As a result, in electrodeposited copper foil with a carrier foil for high-temperature heat-resistance 1a related to the present invention, the stability of peeling of the carrier foil from the copper-clad laminate after being caused to adhere to the substrate at a pressing temperature exceeding 200° C. is improved and it becomes possible to easily peel the carrier foil by manual work.

A second manufacturing method is "a method of manufacturing electrodeposited copper foil with a carrier foil for high-temperature heat-resistance which involves forming an organic adhesive interface layer on a surface of carrier foil by use of an organic agent and forming an electrodeposited copper foil layer on the organic adhesive interface layer, characterized in that the formation of the organic adhesive interface layer on the surface of the carrier foil is performed by acid pickling and dissolving the surface of the carrier foil by use of an acid pickling solution containing 50 ppm to 2000 ppm of organic agent and by simultaneously causing the organic agent to be adsorbed whereby an acid pickled and adsorbed organic film is formed and that a simple adsorbed organic film is further formed by causing the adsorption of the organic agent to occur by bringing an aqueous solution in which the organic agent is dispersed and the acid pickled and absorbed organic film into contact with each other." It appears that the schematic sectional view of electrodeposited copper foil with a carrier foil for high-temperature heat-resistance 1b obtained by this manufacturing method does not show any difference from that shown in FIG. 1. The procedure of this manufacturing method is shown in FIGS. 3(a) to 3(d).

Figure 3:
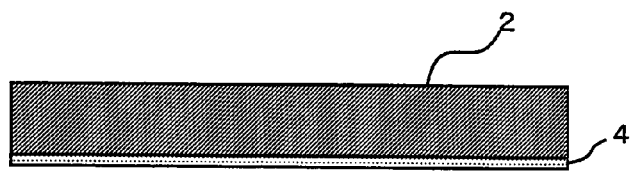
Figure 3:
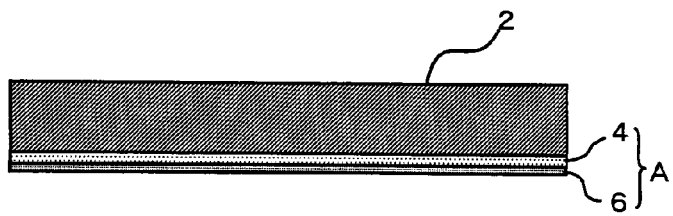
Figure 3:
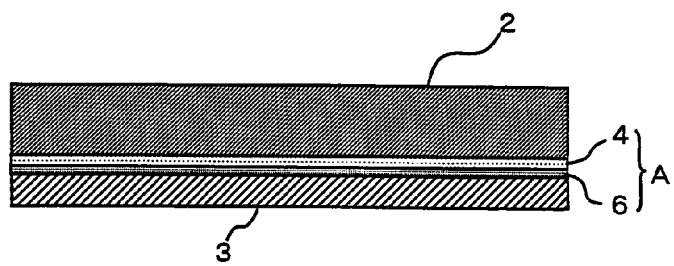
Figure 3:
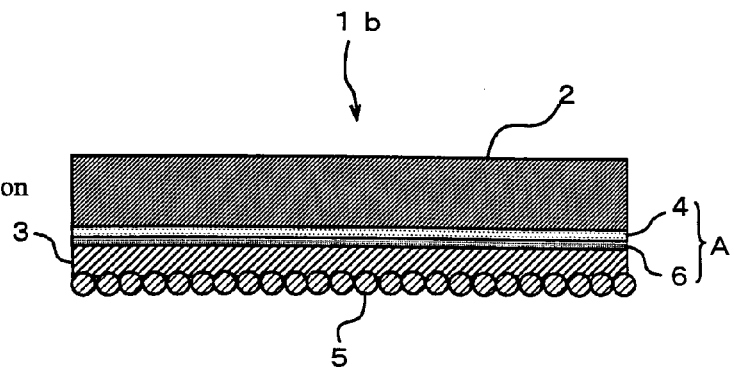
Figure 4:
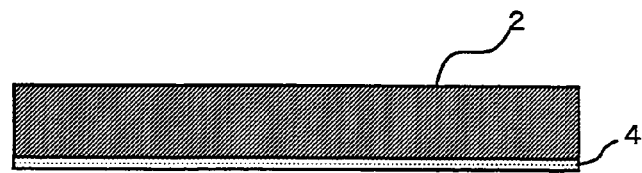
Figure 4:
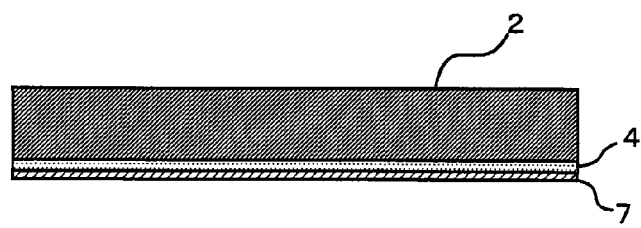
Figure 4:
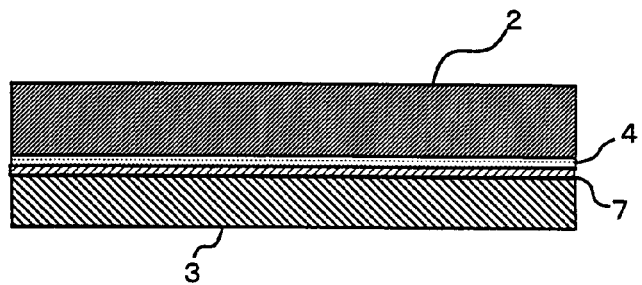
Figure 4:
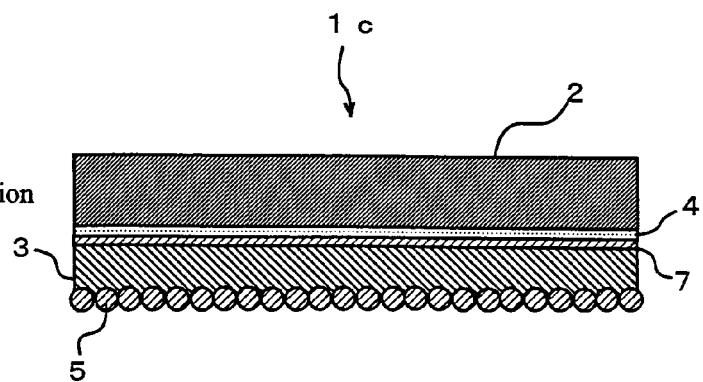
Figure 5:
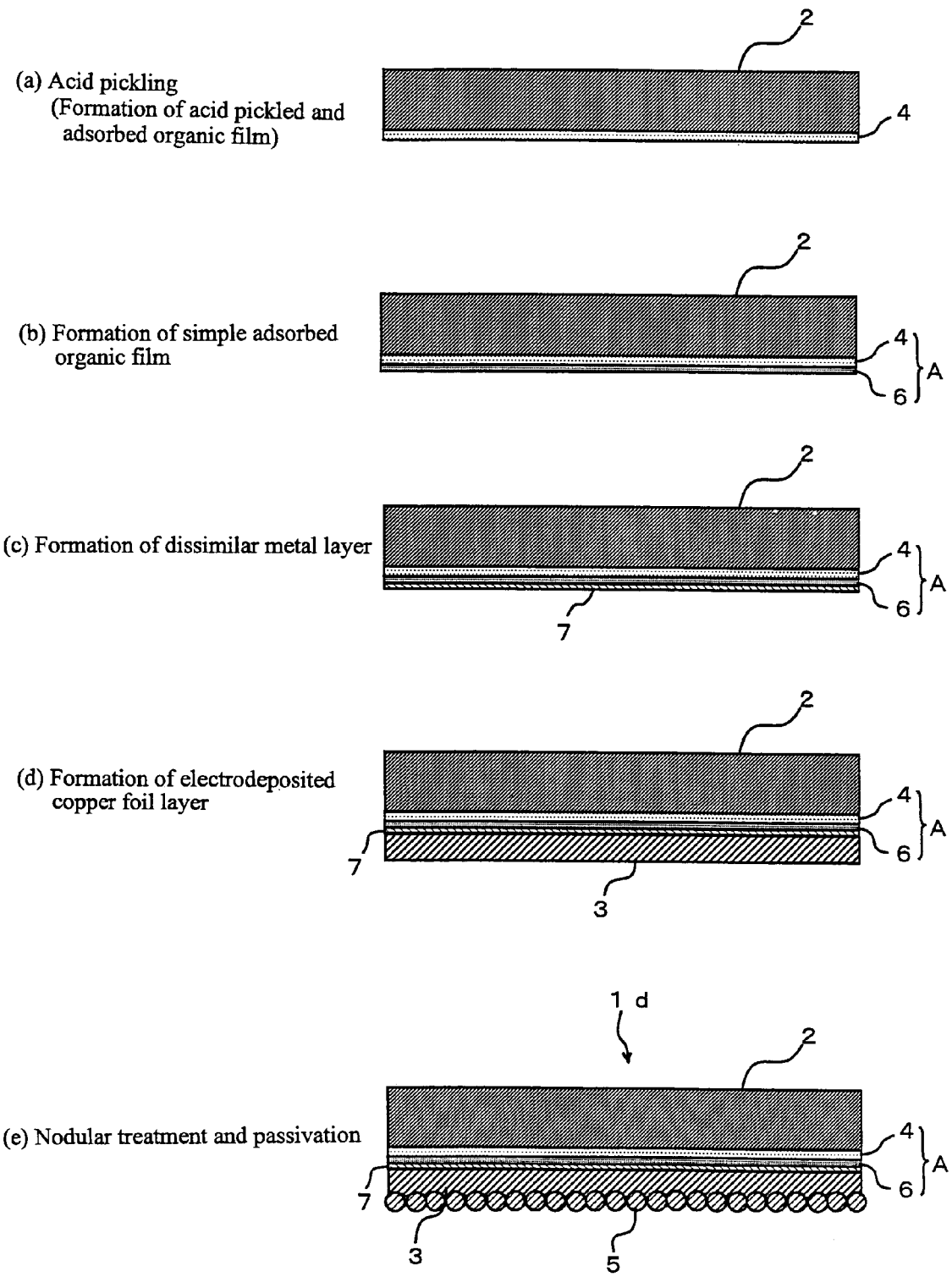

In this manufacturing method, a state shown in FIG. 3(a) is produced by forming an acid pickled and adsorbed organic film 4 on carrier foil 2 by the above-described method, and a new simple adsorbed organic film 6 is formed as shown in FIG. 3(b) by causing an organic agent to be further adsorbed on this acid pickled and adsorbed organic film 4 by use of an aqueous solution containing only the organic agent. Unlike the acid pickled and adsorbed organic film 4, this simple adsorbed organic film 6 is formed by bringing an aqueous solution containing only an organic agent and the acid pickled and adsorbed organic film 4 into contact with each other and thereby causing the organic agent to be adsorbed on the surface of the acid pickled and adsorbed organic film 4. Therefore, this simple adsorbed organic film 6 does not contain the metal component and the adsorbed amount is small compared to the acid pickled and adsorbed organic film 4.

In the formation of this simple adsorbed organic film 6, a solution in which the above-described organic agent is dissolved or dispersed in water as a solvent is prepared, the carrier foil is dipped into this solution so that this solution and a surface of the carrier foil on which the acid pickled and adsorbed organic film 4 is formed are brought into contact with each other, and the carrier foil is pulled up thereafter. Or alternatively, the formation of this simple adsorbed organic film 6 can be performed by using the showering method, the spray method, the dropping method or the electrodeposition for a surface on which the simple adsorbed organic film 6 is to be formed. Thus, it is unnecessary to especially limit techniques.

In all of the above-described organic agents, it is preferred that the concentration of an organic agent in a solution used in the formation of this simple adsorbed organic film 6 be in the range of 0.01 g/l to 10 g/l and that the solution temperature be in the range of 20 to 60° C. The organic agent concentration is not especially limited and essentially there is no problem whether the concentration is high or low. However, if the organic solvent concentration is lower than 0.01 g/l, it becomes difficult to obtain uniform adhesion on the acid pickled and adsorbed organic film surface 4, with the result that variations occur in the thickness of the formed adhesive interface layer and hence variations in product quality become apt to occur. On the other hand, even when the organic agent concentration exceeds 10 g/l, the rate of adsorption of the organic agent on the acid pickled and adsorbed film 4 does not increase with an increasing amount of addition and it cannot be said that this high concentration is desirable from the standpoint of production cost.

Although the organic agent used in the formation of the simple adsorbed organic film 6 is selected from the organic agents used in the formation of the acid pickled and adsorbed organic film 4, it is not always necessary to use the same organic agent as used in the formation of the acid pickled and adsorbed organic film 4 and it is also possible to arbitrarily make a selection from the above-described group of organic agents. By using a combination of different types of organic agents as the organic agent used in the formation of the simple adsorbed organic film 6 and the organic agent used in the formation of the acid pickled and adsorbed organic film 4, it is also possible to obtain performance more suited to the intended use.

In the electrodeposited copper foil with a carrier foil for high-temperature heat-resistance 1b having an organic adhesive interface layer A, which is constituted by the acid pickled and adsorbed organic film 4 and the simple adsorbed organic film 6 as described above, the peel strength when the carrier foil is peeled from the copper foil layer is stable and shows small variations even after the electrodeposited copper foil with a carrier foil for high-temperature heat-resistance 1b is subjected to a heating history by high-temperature pressing compared to the electrodeposited copper foil with a carrier foil for high-temperature heat-resistance 1a having an organic adhesive interface layer which is constituted by only the above-described acid pickled and adhesive organic film 4. Incidentally, because the formation of the electrodeposited copper foil layer 3 shown in FIG. 3(c) and the nodular treatment shown in FIG. 3(d) are the same as described above, their descriptions are omitted in order to avoid overlaps of description.

There has so far been no product of electrodeposited copper foil with a carrier foil having an organic adhesive interface layer in which the peel strength when the carrier foil is peeled from the electrodeposited copper foil becomes stable at a low level even after heating at a high temperature of 230° C. However, the heating temperature which the electrodeposited copper foil with a carrier foil for high-temperature heat-resistance obtained by the above-described two manufacturing methods according to the present invention can withstand is only about 240° C. maximum.

With this being the situation, the present inventors hit upon the idea that by adopting a third manufacturing method and a fourth manufacturing method as described below, it is possible to manufacture electrodeposited copper foil with a carrier foil for high-temperature heat-resistance in which the peel strength when the carrier foil is peeled from the electrodeposited copper foil layer becomes stable at a low level even when the electrodeposited copper foil with a carrier foil for high-temperature heat-resistance is subjected to a heating history of press working at about 300° C.

The third manufacturing method is "a method of manufacturing electrodeposited copper foil with a carrier foil for high-temperature heat-resistance in which an organic adhesive interface layer is formed on a surface of carrier foil by use of an organic agent, a dissimilar metal layer using any one of kind selected from the group consisting of nickel, nickel alloys, cobalt and cobalt alloys is formed on the organic adhesive interface layer, and an electrodeposited copper foil layer is provided on the dissimilar metal layer, characterized in that the formation of the organic adhesive interface layer on the surface of the carrier foil is performed by acid pickling and dissolving the surface of the carrier foil by use of an acid pickling solution containing 50 ppm to 2000 ppm of organic agent and by simultaneously causing the organic agent to be adsorbed whereby an acid pickled and adsorbed organic film is formed and that said dissimilar metal layer is formed on the organic adhesive interface layer as a thin-film metal layer having a thickness of 0.001 μm to 0.05 μm." This manufacturing procedure is schematically shown in FIGS. 4(a) to 4(d).

And the fourth manufacturing method is "a method of manufacturing electrodeposited copper foil with a carrier foil for high-temperature heat-resistance in which an organic adhesive interface layer is formed on a surface of carrier foil by use of an organic agent, a dissimilar metal layer using any one of kind selected from the group consisting of nickel, nickel alloys, cobalt and cobalt alloys is formed on the organic adhesive interface layer, and an electrodeposited copper foil layer is provided on the dissimilar metal layer, characterized in that the formation of the organic adhesive interface layer on the surface of the carrier foil is performed by acid pickling and dissolving the surface of the carrier foil by use of an acid pickling solution containing 50 ppm to 2000 ppm of organic agent and by simultaneously causing the organic agent to be adsorbed whereby an acid pickled and adsorbed organic film is formed, that a simple adsorbed organic film is further formed by bringing an aqueous solution in which the organic agent is dispersed and the acid pickled and absorbed organic film into contact with each other and thereby causing the adsorption of the organic agent to occur, and that the dissimilar metal layer is formed on the organic adhesive interface layer as a thin-film metal layer having a thickness of 0.001 µm to 0.05 µm." This manufacturing procedure is schematically shown in FIGS. 5(a) to 5(e).

That is, by the third manufacturing method is manufactured electrodeposited copper foil with a carrier foil for high-temperature heat-resistance 1c having a dissimilar metal layer 7 between the organic adhesive interface layer 4 and the electrodeposited copper foil layer 3 of the above-described first manufacturing method. And by the fourth manufacturing method is manufactured electrodeposited copper foil with a carrier foil for high-temperature heat-resistance 1d having a dissimilar metal layer 7 between the organic adhesive interface layer A and the electrodeposited copper foil layer 3 of the above-described second manufacturing method. Although the two types of electrodeposited copper foil with a carrier foil for high-temperature heat-resistance have a layer construction as shown in the schematic sectional views of FIG. 4(d) and FIG. 5(e), it is difficult to discriminate by appearances between the two types of electrodeposited copper foil with a carrier foil for high-temperature heat-resistance 1c and 1d respectively manufactured by the third manufacturing method and the fourth manufacturing method. The descriptions of the method of forming the organic adhesive interface layer and the electrodeposited copper layer are the same as described above and in order to avoid overlaps of description, a description will be given only of the method of forming the dissimilar metal layer 7 which is performed after the formation of the organic adhesive interface layer and before the formation of the electrodeposited copper foil.

By causing the carrier foil itself, on which the organic adhesive interface layer has been formed, to be cathode polarized in a copper electrolyte containing a dissimilar metal, the dissimilar metal component is precipitated on the organic adhesive interface layer to form a copper foil layer as this dissimilar metal foil layer 7. The dissimilar metal layer used here is constituted by nickel, nickel alloys, such as nickel-phosphorus, nickel-chromium and nickel-tin-phosphorus, cobalt and cobalt alloys, such as cobalt-phosphorus, cobalt-nickel-phosphorus and cobalt-tin-phosphorous. When electrodeposited copper foil with a carrier foil for high-temperature heat-resistance having this dissimilar metal layer is bonded to a substrate and the carrier foil is removed, this dissimilar metal layer is exposed on the surface of the copper-clad laminate. Because this dissimilar metal layer is very thin, it is possible to completely remove it with an ordinary copper etching solution and this dissimilar metal layer does not produce a bottleneck in etching.

However, the presence of the dissimilar metal layer 7 performs a great role in terms of a dramatic improvement in high-temperature heat resistance. It seems that when the pressing temperature exceeds 300° C. with the organic adhesive interface layer 4, A and the electrodeposited copper foil layer 3 in direct connection with each other, the mutual diffusion between the organic solvent constituting the organic adhesive interface layer and the copper constituting the electrodeposited copper foil layer 3 occurs at a certain level. It might be thought that the above-described mutual diffusion is suppressed at this time by the presence of the dissimilar metal layer 7 as a barrier layer between the organic adhesive interface layer 4, A and the electrodeposited copper foil layer 3. If the mutual diffusion of the component elements between the organic adhesive interface layer 4, A and the electrodeposited copper foil layer 3, this becomes effective means for preventing the disappearance of the organic adhesive interface layer 4, A under high-temperature pressing conditions.

The specified thickness of the dissimilar metal layer 7 is in the range of 0.001 µm to 0.05 µm. This thickness is a reduced thickness calculated from a coating amount per unit area of a dissimilar metal on the assumption that the dissimilar metal layer 7 is formed on a complete plane. When the thickness of this dissimilar metal layer 7 is considered, it is found that this is a very thin layer. When the thickness of this dissimilar metal layer 7 is less than 0.001 µm, among the above-described roles of the dissimilar metal layer 7, the role as the barrier layer is not performed and the stability of heat resistance is impaired. On the other hand, when the thickness of this dissimilar metal layer 7 exceeds 0.05 µm, the variations in the peel strength of the carrier foil 2 of the electrodeposited copper foil with a carrier foil for high-temperature heat-resistance 1c, 1d increase, though the cause of this increase in variations has not been identified.

As will be described in the following embodiments by showing data in order to support this fact, even when the electrodeposited copper foil with a carrier foil for high-temperature heat-resistance 1c, 1d having the dissimilar metal layer 7 are subjected to a thermal history during press forming in which the maximum reached temperature is 300° C., the carrier foil can be easily peeled from the electrodeposited copper foil layer in a stable manner. When a similar thermal history is given to the electrodeposited copper foil with a carrier foil for high-temperature heat-resistance 1a, 1b having no dissimilar metal layer 7, which are obtained by the first and second manufacturing methods, the carrier foil sticks and comes to an unpeelable state.

Even when used not only in the pressing step in which a high-temperature thermal history is applied, but also under the ordinary press working conditions at which the usual maximum reached temperature is about 180° C., the above-described electrodeposited copper foil with a carrier foil for high-temperature heat-resistance obtained by the manufacturing methods related to the present invention can ensure excellent stability of the peel strength of the carrier foil, resulting in a remarkable improvement in working reliability. Therefore, a substrate for which the electrodeposited copper foil with a carrier foil for high-temperature heat-resistance related to the present invention is used can be applied not only to polyimide substrates, fluoroplastic substrates, low dielectric constant substrates, etc., but also to all rejet-base substrates, flexible substrates such as what is called TAB and COB, hybrid substrates, etc.

BEST MODE FOR CARRYING OUT THE INVENTION

The present invention will be described in further detail below through embodiments of the invention. Incidentally, electrodeposited copper foil was used as the carrier foil of each of the embodiments described below. By using electrodeposited copper foil in the carrier foil, it becomes easy to recycle the carrier foil after peeling and hence from the standpoint of environmental protection, the carrier foil does not cause industrial wastes to be generated unnecessarily. For example, it is also possible to recycle carrier foil and to make copper ingots by remelting the recycled carrier foil. Also, it is possible to melt the recycled carrier foil again with sulfuric acid as a material for manufacturing electrodeposited copper layers thereby to prepare a copper sulfide solution.

First Embodiment

In this embodiment, 18 μm thick electrodeposited copper foil not subjected to nodular treatment or passivation, which is classified as Grade 3, was used as the carrier foil. The flow of process of this embodiment is confirmed beforehand. Electrodeposited copper foil with a carrier foil for high-temperature heat-resistance was obtained by performing production in the order: [1] the step of forming an acid pickled and adsorbed organic layer, [2] the step of forming an electrodeposited copper foil layer, [3] the step of nodular treatment, [4] the step of passivation and by finally performing rinsing with water and drying. A description will be given below in the order of the steps.

First in the step of forming an acid pickled and adsorbed organic layer, an acid pickled and adsorbed organic layer was formed on the surface of the carrier foil. In the step of forming an acid pickled and adsorbed organic layer, a treatment vessel was filled with an organic agent-containing aqueous solution of dilute sulfuric acid with a CBTA concentration of 800 ppm, a sulfuric acid concentration of 150 g/l and a copper concentration of 10 g/l and at a solution temperature of 30° C. By dipping the carrier foil into this solution for 30 seconds and pulling it up thereafter, fats and oils and other contaminating components adhering to the carrier foil were removed by acid pickling and, at the same time, CBTA was caused to be adsorbed on the surface of the carrier foil and an acid pickled and adsorbed organic film was formed on the surface of the carrier foil. This acid pickled and adsorbed organic film was used as an organic adhesive interface layer. Incidentally, it follows that the acid pickled and adsorbed organic film at this time is formed on both surfaces of the carrier foil.

When the step of forming an acid pickled and adsorbed organic layer was completed, in the step of forming an electrodeposited copper foil layer, an electrodeposited copper foil layer was formed on one side of the organic adhesive interface layers formed on both surfaces of the carrier foil. In the formation of the electrodeposited copper foil layer, the interior of a copper electrolysis vessel was filled with a copper sulfide solution with a sulfuric acid concentration of 150 g/l and a copper concentration of 65 g/l and at a solution temperature of 45° C. In order to cathode polarize the carrier foil itself, electrolysis was performed, with one side of the carrier foil after the formation of the organic adhesive interface layer which was dipped in this solution and a stainless steel plate as an anode electrode spaced apart in parallel with each other. The same technique was adopted when the electrolysis method was adopted later. The electrolysis was performed under level plating conditions at a current density of 15 A/dm$^2$ and a 3 μm thick electrodeposited copper foil layer was formed on the organic adhesive interface layer on one side of the carrier foil.

When the step of forming an electrodeposited copper foil layer was completed, in the next step of nodular treatment, the surface of the electrodeposited copper foil layer was subjected to the nodular treatment. In the nodular treatment, fine copper particles were first deposited and formed on the electrodeposited copper foil layer and covering plating was then performed in order to prevent the fine copper particles from falling off.

The deposition and formation of the fine copper particles was performed using a copper sulfate solution as a copper electrolyte with a sulfuric acid concentration of 100 g/l and a copper concentration of 18 g/l and at a solution temperature of 25° C. by conducting electrolysis for 10 seconds under burn plating conditions at a current density of 10 A/dm$^2$.

The covering plating was performed using a copper sulfate solution as a copper electrolyte with a sulfuric acid concentration of 150 g/l and a copper concentration of 65 g/l and at a solution temperature of 45° C. by conducting electrolysis for 20 seconds under level plating conditions at a current density of 15 A/dm$^2$.

After the step of nodular treatment was completed, in order to prevent the corrosion of the carrier foil and the electrodeposited copper foil surface subjected to the nodular treatment, in the step of passivation, the passivation was performed by causing zinc to be precipitated on both surfaces by the electrolysis process. In the zinc deposition at this time, a zinc sulfate solution with a sulfuric acid concentration of 70 g/l and a zinc concentration of 20 g/l was used and the conditions of a solution temperature of 40° C. and a current density of 15 A/dm$^2$ were adopted. Electrodeposited copper foil with a carrier foil for high-temperature heat-preventing purpose was produced after these steps.

When the passivation is finished finally, completed electrodeposited copper foil with a carrier foil for high-temperature heat-preventing purpose was obtained by performing rinsing with water and final drying. Incidentally, by performing rinsing with water as required between the steps above, the solutions of the preceding steps were prevented from being carried over.

The peel strength of the carrier foil and electrodeposited copper foil layer of this electrodeposited copper foil with a carrier foil for high-temperature heat-preventing purpose was measured. As a result, this peel strength was 18 gf/cm before heating and 24 gf/cm (standard deviation: 1.12 gf/cm) after heating at 230° C. for 1 hour. Peeling was impossible after heating at 300° C. for 1 hour. Incidentally, the values of peel strength in each embodiment of this specification are averaged values of 10 lots of products and a standard deviation of peel strength after heating at 230° C. for 1 hour was shown also in the following embodiments as an index of comparison of the stability of peel strength.

Second Embodiment

In this embodiment was produced electrodeposited copper foil with a carrier foil for high-temperature heat-resistance in which an organic adhesive interface layer is constituted by an acid pickled and adsorbed organic layer and a simple adsorbed organic layer. The manufacturing method is basically the same as in the first embodiment, and the step of forming a simple adsorbed organic layer is provided between the step of forming an acid pickled and absorbed organic layer and the step of forming an electrodeposited copper foil layer of the first embodiment. Therefore, descriptions which might overlap the first embodiment are omitted and only the step of forming a simple adsorbed organic layer is described.

Carrier foil for which the formation of an acid pickled and adsorbed organic layer has been completed in the same way as in the first embodiment enters next the step of forming a simple adsorbed organic layer. In this embodiment, a simple adsorbed organic layer was formed on the acid pickled and adsorbed organic layer by performing showering so that a pH 5 aqueous solution having a solution temperature of 40° C. and containing CBTA in a concentration of 5 g/l and one side of the carrier foil on which the acid pickled and adsorbed organic layer had been formed came into contact with each other for 30 seconds. In this manner, the organic adhesive interface layer constituted by the acid pickled and adsorbed organic layer and the simple adsorbed organic layer was formed on one side of the carrier foil.

For confirmation, the flow of process is described here. The production of the electrodeposited copper foil with a carrier foil for high-temperature heat-resistance in this embodiment was performed in the order: [1] the step of forming an acid pickled and adsorbed organic layer (described in the first embodiment), [2] the step of forming a simple adsorbed organic layer, [3] the step of forming an electrodeposited copper foil layer (described in the first embodiment), [4] the step of nodular treatment (described in the first embodiment), [5] the step of passivation (described in the first embodiment) and by finally performing rinsing with water and drying, the electrodeposited copper foil with a carrier foil for high-temperature heat-resistance was obtained.

The peel strength of the carrier foil layer and electrodeposited copper foil layer of this electrodeposited copper foil with a carrier foil for high-temperature heat-resistance was measured. As a result, this peel strength was 12 gf/cm before heating and 18 gf/cm (standard deviation: 0.85 gf/cm) after heating at 230° C. for 1 hour. Peeling was impossible after heating at 300° C. for 1 hour.

Third Embodiment

In this embodiment was produced electrodeposited copper foil with a carrier foil for high-temperature heat-resistance in which an organic adhesive interface layer is constituted by only an acid pickled and adsorbed organic layer and a dissimilar metal layer is provided between this organic adhesive interface layer and an electrodeposited copper foil layer. The manufacturing method is basically the same as in the first embodiment, and the step of forming a dissimilar metal layer is provided between the step of forming an acid pickled and adsorbed organic layer and the step of forming an electrodeposited copper foil layer of the first embodiment. Therefore, descriptions which might overlap the first embodiment are omitted and only the step of a dissimilar metal layer is described.

Carrier foil for which the formation of an acid pickled and adsorbed organic layer has been completed in the same way as in the first embodiment enters next the step of forming a dissimilar metal layer. In this embodiment, a nickel thin layer was formed as the dissimilar metal layer. A Watt bath of pH 3 containing 330 g/l of nickel sulfate ($NiSO_4.6H_2O$), 45 g/l of nickel chloride ($NiCl_2.6H_2O$) and 35 g/l of boric acid was used as the nickel electrolyte used at this time and electrolysis was performed at a solution temperature of 45° C. and a current density of 2.5 $A/dm^2$. In this embodiment, in order to cathode polarize the carrier foil itself in a nickel electrolyte, a current was passed, with one side of the carrier foil after the formation of the organic adhesive interface layer which was dipped in this solution and a nickel plate as an anode electrode spaced apart in parallel with each other. The reduced thickness of the dissimilar metal layer which was a nickel thin layer at this time was 0.01 μm.

For confirmation, the flow of process is described here. The production of the electrodeposited copper foil with a carrier foil for high-temperature heat-resistance in this embodiment was performed in the order: [1] the step of forming an acid pickled and adsorbed organic layer (described in the first embodiment), [2] the step of forming a dissimilar metal layer (described in the third embodiment), [3] the step of forming an electrodeposited copper foil layer (described in the first embodiment), [4] the step of nodular treatment (described in the first embodiment), [5] the step of passivation (described in the first embodiment) and by finally performing rinsing with water and drying, the electrodeposited copper foil with a carrier foil for high-temperature heat-resistance was obtained.

The peel strength of the carrier foil layer and electrodeposited copper foil layer of this electrodeposited copper foil with a carrier foil for high-temperature heat-resistance was measured. As a result, this peel strength was 12 gf/cm before heating, 18 gf/cm (standard deviation: 0.64 gf/cm) after heating at 230° C. for 1 hour and 25 gf/cm after heating at 300° C. for 1 hour.

Fourth Embodiment

In this embodiment was produced electrodeposited copper foil with a carrier foil for high-temperature heat-resistance in which an organic adhesive interface layer is constituted by an acid pickled and adsorbed organic layer and a simple adsorbed organic layer and a dissimilar metal layer is provided between this organic adhesive interface layer and an electrodeposited copper foil layer. The manufacturing method is basically the same as in the second embodiment, and the step of forming a dissimilar metal layer is provided between the step of forming a simple adsorbed organic layer and the step of forming an electrodeposited copper foil layer of the second embodiment. In addition, the formation of a dissimilar metal layer is the same as in the third embodiment. The descriptions of each step were given in each of the steps of the above-described first to third embodiments and provide overlaps if they are given again. Therefore, these descriptions are omitted here.

For confirmation, the flow of process is described here. The production of the electrodeposited copper foil with a carrier foil for high-temperature heat-resistance in this embodiment was performed in the order: [1] the step of forming an acid pickled and adsorbed organic layer (described in the first embodiment), [2] the step of forming a simple adsorbed organic layer (described in the second embodiment), [3] the step of forming a dissimilar metal layer (described in the third embodiment), [4] the step of forming an electrodeposited copper foil layer (described in the first embodiment), [5] the step of nodular treatment (described in the first embodiment), [6] the step of passivation (described in the first embodiment) and by finally performing rinsing with water and drying, the electrodeposited copper foil with a carrier foil for high-temperature heat-resistance was obtained.

The peel strength of the carrier foil layer and electrodeposited copper foil layer of this electrodeposited copper foil with a carrier foil for high-temperature heat-resistance was measured. As a result, this peel strength was 10 gf/cm before heating, 15 gf/cm (standard deviation: 0.37 gf/cm) after heating at 230° C. for 1 hour and 21 gf/cm after heating at 300° C. for 1 hour.

COMPARATIVE EXAMPLE

In this comparative example, electrodeposited copper foil with a carrier foil in which a simple adsorbed organic layer is used as the organic adhesive interface layer of the first embodiment was produced and compared with the above-described embodiments. That is, the electrodeposited copper foil with a carrier foil used in this comparative example was obtained by performing production in the order: [1] the step of forming a simple adsorbed organic layer (described in the second embodiment), [2] the step of forming an electrodeposited copper foil layer (described in the first embodiment), [3] the step of nodular treatment (described in the first embodiment), [4] the step of passivation (described in the first embodiment) and by finally performing rinsing with water and drying. Therefore, the descriptions of each step were given in the above-described embodiments and are hence omitted here in order to avoid overlaps of description.

The peel strength of the carrier foil layer and electrodeposited copper foil layer of this electrodeposited copper foil with a carrier foil was measured. As a result, this peel strength was 10 gf/cm before heating and peeling was quite impossible after heating at 230° C. or higher for 1 hour. So long as the present inventors could ascertain, the carrier foil could be peeled by manual work without a problem even after heating for 1 hour at temperatures of 190° C. or lower.

The following becomes apparent from comparisons between the embodiments and comparative example described above. It is apparent that the conventional electrodeposited copper foil with a carrier foil of the comparative example, in which the adhesive interface layer is constituted by only a simple adsorbed organic layer, is inferior in the high-temperature heat resisting property to any of the electrodeposited copper foil with a carrier foil for high-temperature heat-resistance related to the above-described embodiments, in which the adhesive interface layer includes an acid pickled and adsorbed organic layer.

And the following becomes apparent by comparing the embodiments with each other. The electrodeposited copper foil with a carrier foil for high-temperature heat-resistance obtained by the manufacturing method of the first embodiment and the electrodeposited copper foil with a carrier foil for high-temperature heat-resistance obtained by the manufacturing method of the second embodiment differ from each other only in that whether the organic adhesive interface layer is constituted by only an acid pickled and adsorbed organic layer or an acid pickled and adsorbed organic layer and a simple adsorbed organic layer. In the latter, however, the peel strength after heating at high temperatures tends to decrease and show smaller variations.

Furthermore, as is apparent from a comparison between the first embodiment and the third embodiment and a comparison between the second embodiment and the third embodiment, due to the presence of a dissimilar metal layer such as nickel and cobalt, the high-temperature heat-resisting property is further improved. And even after heating at a temperature of 300° C., the carrier foil can be peeled and besides the peel strength of the carrier foil becomes stabilized at a low level.

INDUSTRIAL APPLICABILITY

By adopting the methods of manufacturing electrodeposited copper foil with a carrier foil for high-temperature heat-resistance related to the present invention, it has become possible to obtain electrodeposited copper foil with a carrier foil for high-temperature heat-resistance in which the carrier foil can be easily peeled by manual work even after the application of a thermal history of press working in which the maximum reached temperature is 200° C. or higher. This is for the first time in the electrodeposited copper foil with a carrier foil in which an organic agent is used in the adhesive interface layer. Therefore, by using the electrodeposited copper foil with a carrier foil for high-temperature heat-resistance obtained by the manufacturing methods related to the present invention, it becomes possible to establish a copper-clad laminate process in which a thin-film copper layer can be easily bonded to a substrate resin which requires high-temperature pressing work.

The invention claimed is:

1. A method of manufacturing an electrodeposited copper foil combined with a carrier foil, the combination having high-temperature heat resistance, comprising the steps of:
    (1) forming an organic adhesive interface layer on a surface of a carrier foil by immersing said carrier foil into an acid pickling solution containing 50 ppm to 2000 ppm organic agent to pickle, the metal on the surface of the carrier foil and create metal ions in the acid pickling solution, wherein said metal ions react with said organic agent to create a metal complex which precipitates and adsorbs to the carrier foil to form the organic adhesive interface layer; and thereafter
    (2) electrodepositing a copper foil layer onto said organic adhesive interface layer.

2. The method of claim 1 wherein said electrodeposited copper foil combined with the carrier foil is heat resistant at a temperature between 230° C. and 300° C.

3. A method of manufacturing an electrodeposited copper foil in combination with a carrier foil, the combination having high-temperature resistance, comprising the steps of:
    (1) forming an organic adhesive interface layer on a surface of a carrier foil by immersing said carrier foil into an acid pickling solution containing 50 ppm to 2000 ppm organic agent to pickle, the metal on the surface of the carrier foil and create metal ions in the acid solution, wherein said metal ions react with said organic agent in said acid pickling solution to create a metal complex which precipitates and adsorbs to the carrier foil to form the organic adhesive interface layer; and thereafter
    (2) electrodepositing a copper foil layer onto said organic adhesive interface layer.

4. The method of claim 3 wherein said electrodeposited copper foil in combination with the carrier foil is heat resistant at a temperature between 230° C. and 300° C.

5. A method of manufacturing an electrodeposited copper foil in combination with a carrier foil, the combination having high-temperature heat-resistance, comprising the steps of:
    (1) forming a first organic adhesive interface layer on a surface of a carrier foil by immersing said carrier foil into an acid pickling solution containing 50 ppm to 2000 ppm of a first organic agent to pickle the metal on the surface of the carrier foil and create metal ions in the acid pickling solution, wherein said metal ions react with said first organic agent in the acid pickling solution, forming a complex which precipitates and adsorbs to the carrier foil;
    (2) forming a second organic adhesive interface layer in contact with the first organic adhesive interface layer by immersing the carrier foil in an aqueous solution containing a second organic agent whereby said second organic agent adsorbs onto the first organic adhesive interface layer; and
    (3) electrodepositing a copper foil layer onto the second organic adhesive interface layer.

6. The method of claim 5 wherein said electrodeposited copper foil in combination with the carrier foil is heat resistant at a temperature between 230° C. and 300° C.

7. A method of manufacturing an electrodeposited copper foil in combination with a carrier foil having high-temperature resistance, comprising the steps of:
    (1) forming an organic adhesive interface layer on a surface of a carrier foil by immersing said carrier foil into an acid pickling solution containing 50 ppm to 2000 ppm organic agent, to pickle the metal on the surface of the carrier foil and create metal ions in the acid pickling solution, wherein said metal ions react with the organic agent in the acid pickling solution to create a metal complex which precipitates and adsorbs to the carrier foil;

(2) immersing the carrier foil into a second solution containing a dissimilar metal selected from the group consisting of nickel, nickel alloys, cobalt, and cobalt alloys;

(3) passing a current through said second solution to cause the dissimilar metal to adhere to the organic adhesive interface layer to create a dissimilar metal layer having a thickness of 0.001 µm to 0.05 µm; and (4) electrodepositing a copper foil layer onto said dissimilar metal layer.

8. The method of claim 7 wherein said electrodeposited copper foil in combination with the carrier foil is heat resistant at a temperature between 230° C. and 300° C.

9. A method of manufacturing an electrodeposited copper foil in combination with a carrier foil, the combination having high-temperature resistance, comprising the steps of:

(1) forming a first organic adhesive interface layer on a surface of a carrier foil by immersing said carrier foil into an acid pickling solution containing 50 ppm to 2000 ppm of a first organic agent to pickle the metal on the surface of the carrier foil and create metal ions in the acid solution, wherein said metal ions react with said first organic agent in the acid pickling solution to create a metal complex which precipitates and adsorbs to the carrier foil;

(2) forming a second organic adhesive interface layer in contact with the first organic adhesive interface layer by immersing the carrier foil in an aqueous solution containing a second organic agent thereby adsorbing said second organic agent onto the first organic adhesive interface layer;

(3) immersing the carrier foil into a second solution containing a dissimilar metal selected from the group consisting of nickel, nickel alloys, cobalt, and cobalt alloys;

(4) passing a current through said second solution to cause the dissimilar metal to adhere to the second organic adhesive interface layer to create a dissimilar metal layer having a thickness of 0.001 µm to 0.05 µm; and (5) electrodepositing a copper foil layer onto the dissimilar metal layer.

10. The method of claim 9 wherein said electrodeposited copper foil in combination with the carrier foil is heat resistant at a temperature between 230° C. and 300° C.

11. An electrodeposited copper foil in combination with a carrier foil exhibiting high-temperature heat-resistance, wherein the copper foil in combination with a carrier foil is obtained by the method of claim 1.

12. An electrodeposited copper foil in combination with a carrier foil exhibiting high-temperature heat-resistance, wherein the electrodeposited copper foil and the carrier foil is obtained by the method of claim 3.

13. An electrodeposited copper foil in combination with carrier foil exhibiting high-temperature heat-resistance, wherein the electrodeposited copper foil and the carrier foil is obtained by the method of claim 5.

14. An electrodeposited copper foil in combination with carrier foil exhibiting high-temperature heat-resistance, wherein the electrodeposited copper foil and the carrier foil is obtained by the method of claim 7.

15. An electrodeposited copper foil in combination with a carrier foil array exhibiting high-temperature heat-resistance obtained by the method of claim 9.

* * * * *